(12) United States Patent
Gawase et al.

(10) Patent No.: US 10,991,588 B2
(45) Date of Patent: Apr. 27, 2021

(54) MANUFACTURING METHOD OF SEMICONDUCTOR DEVICE AND SEMICONDUCTOR DEVICE MANUFACTURING APPARATUS

(71) Applicant: Toshiba Memory Corporation, Tokyo (JP)

(72) Inventors: Akifumi Gawase, Kuwana Mie (JP); Yukiteru Matsui, Nagoya Aichi (JP); Takahiko Kawasaki, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 256 days.

(21) Appl. No.: 15/803,876

(22) Filed: Nov. 6, 2017

(65) Prior Publication Data

US 2018/0061654 A1    Mar. 1, 2018

Related U.S. Application Data

(62) Division of application No. 15/066,408, filed on Mar. 10, 2016, now Pat. No. 9,837,279.

(30) Foreign Application Priority Data

Sep. 16, 2015 (JP) .................. 2015-183159

(51) Int. Cl.
| | |
|---|---|
| *H01L 21/306* | (2006.01) |
| *H01L 21/687* | (2006.01) |
| *H01L 21/67* | (2006.01) |
| *H01L 21/321* | (2006.01) |

(52) U.S. Cl.
CPC .. *H01L 21/30604* (2013.01); *H01L 21/32115* (2013.01); *H01L 21/6708* (2013.01); *H01L 21/67075* (2013.01); *H01L 21/67086* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 6,818,095 B1* | 11/2004 | Kim | ............. | B24B 37/14 156/345.12 |
| 7,252,736 B1* | 8/2007 | Boyd | ............. | B24B 7/228 156/345.12 |
| 7,378,004 B2* | 5/2008 | Uzoh | ............. | B23H 5/08 204/212 |

(Continued)

FOREIGN PATENT DOCUMENTS

| | | |
|---|---|---|
| JP | 2002-299294 | 10/2002 |
| JP | 2004-72099 | 3/2004 |

(Continued)

*Primary Examiner* — Sylvia MacArthur
(74) *Attorney, Agent, or Firm* — Finnegan, Henderson, Farabow, Garrett & Dunner L.L.P.

(57) ABSTRACT

In accordance with an embodiment, a manufacturing method of a semiconductor device includes bringing a first catalyst into contact with a workpiece to form an oxide film on a surface of the workpiece, and bringing a second catalyst different from the first catalyst and the oxide film into contact with each other or moving the second catalyst and the oxide film closer to each other to elute the oxide film into a treatment liquid.

26 Claims, 6 Drawing Sheets

(56) References Cited

U.S. PATENT DOCUMENTS

| | | | |
|---|---|---|---|
| 7,651,625 B2 | 1/2010 | Yamauchi et al. | |
| 8,414,357 B2* | 4/2013 | Wang | B24B 37/04 |
| | | | 451/41 |
| 8,734,661 B2 | 5/2014 | Yamauchi et al. | |
| 8,912,095 B2* | 12/2014 | Sano | H01L 21/32125 |
| | | | 438/692 |
| 2006/0073768 A1* | 4/2006 | Mavliev | B23H 5/08 |
| | | | 451/6 |
| 2008/0073222 A1* | 3/2008 | Yamauchi | H01L 21/32134 |
| | | | 205/655 |
| 2011/0294291 A1 | 12/2011 | Matsui et al. | |
| 2014/0220778 A1 | 8/2014 | Gawase et al. | |
| 2018/0061654 A1* | 3/2018 | Gawase | H01L 21/30604 |

FOREIGN PATENT DOCUMENTS

| | | |
|---|---|---|
| JP | 2008-121099 | 5/2008 |
| JP | 2009-117782 | 5/2009 |
| JP | 2015-128161 | 7/2015 |

\* cited by examiner

MANUFACTURING METHOD OF SEMICONDUCTOR DEVICE AND SEMICONDUCTOR DEVICE MANUFACTURING APPARATUS

CROSS REFERENCE TO RELATED APPLICATIONS

This is a division of application Ser. No. 15/066,408, filed Mar. 10, 2016, which is incorporated herein by reference.

This application is based upon and claims the benefit of priority from the prior Japanese Patent Application No. 2015-183159, filed on Sep. 16, 2015, the entire contents of which are incorporated herein by reference.

FIELD

Embodiments described herein relate generally to a manufacturing method of a semiconductor device and a semiconductor device manufacturing apparatus.

BACKGROUND

Recently, in the manufacture of semiconductors, a CMP (Chemical Mechanical Polishing) method is extensively used to flatten an insulator film, a metal film, or a polycrystalline silicon film formed with the intention of filling grooves on each substrate surface. The CMP method is a method of supplying a polishing agent (slurry) containing abrasive grains and a chemical solution onto a polishing pad, and bringing workpieces into contact with the polishing pad to combine a chemical action of the chemical solution with a mechanical action of the abrasive grains, thereby flattening surfaces of the workpieces. According to this method, however, there is a problem that mechanical damage due to the abrasive grains cannot be avoided and polishing damage occurs on the surfaces of the workpieces.

DETAILED DESCRIPTION

In accordance with an embodiment, a manufacturing method of a semiconductor device includes bringing a first catalyst into contact with a workpiece to form an oxide film on a surface of the workpiece, and bringing a second catalyst different from the first catalyst and the oxide film into contact with each other or moving the second catalyst and the oxide film closer to each other to elute the oxide film into a treatment liquid.

Embodiments will now be explained with reference to the accompanying drawings. Like components are provided with like reference signs throughout the drawings and repeated descriptions thereof are appropriately omitted. It is to be noted that the accompanying drawings illustrate the invention and assist in the understanding of the illustration and that the shapes, dimensions, and ratios and so on in each of the drawings may be different in some parts from those in an actual apparatus.

In the specification of the present application, terms indicating directions such as "upper" and "lower" in the explanation show relative directions when a surface to be processed on a processing target is set as the top. Therefore, the directions may be different from actual directions based on gravitational acceleration directions.

(A) Manufacturing Method of Semiconductor Device

A manufacturing method of a semiconductor device according to an embodiment will now be described with reference to cross-sectional views of FIG. 1 to FIG. 3.

Figure 1:
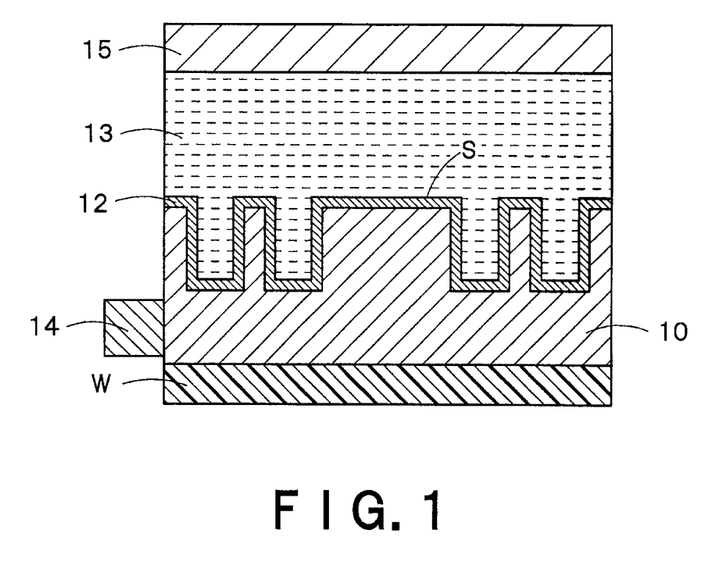
FIG. 1 to FIG. 3 are examples of schematic cross-sectional views for explaining a manufacturing method of a semiconductor device according to an embodiment.

First, a workpiece 10, a first catalyst 14, a second catalyst 15, and a treatment liquid 13 are prepared (see FIG. 1). In this embodiment, as the workpiece 10, a metal film 10 formed on a semiconductor wafer W is taken. A surface to be treated S of the metal film 10 has unevenness that is a target of a flattening treatment.

The first catalyst 14 is an oxidizing catalyst and, for example, a material selected as the first catalyst 14 is provided by forming a metal that is nobler than a metal of the metal film 10, i.e., a metal having a lower ionization tendency than the metal of the metal film 10 such as silver (Ag), palladium (Pd), or gold (Au) to come into contact with at least the metal film 10. The first catalyst 14 has a role of taking electrons from the metal film 10 and promoting oxidation of the metal film 10 when it is in contact with the metal film 10. In FIG. 1, the first catalyst 14 is in contact with a side surface of the metal film 10, but it may be in contact with other portions such as an upper surface of the metal film 10.

The treatment liquid 13 is a liquid solution that can supply hydroxide ions to the surface of the metal film 10 from which the electrons have been taken, and thereby form an oxide, and pure water ($H_2O$) is selected in this embodiment.

It is to be noted that, as will be described later, an oxidizing agent, e.g., a hydrogen peroxide ($H_2O_2$) may be added to increase treatment speed.

The second catalyst 15 is a basic catalyst and, for example, a metal-oxide catalyst or an ion-exchange resin catalyst is selected. As metal oxides, there are, e.g., an alkali metal oxide, an alkaline-earth metal oxide, and a rare-earth metal oxide, and more specifically, a magnesium oxide (MgO) or a calcium oxide (CaO) can be used. Further, as examples of ion exchange resins, there are materials such as (aromatic ring) —N(R3)+.

The second catalyst 15 has a flat plate parallel to a flat surface of a semiconductor wafer W. The second catalyst 15 has a role of promoting supply of hydroxide ions from the treatment liquid 13. Thus, when the second catalyst 15 and the metal film 10 are brought into contact with each other or moved closer to each other, an oxide film formed on the surface of the metal film 10 can be reacted with the hydroxide ions from the treatment liquid 13 and eluted into the treatment liquid 13.

As shown in FIG. 1, the second catalyst 14 is arranged to come into contact with the metal film 10 in any region of the metal film 10, and the treatment liquid 13 is supplied to the surface to be treated S of the metal film 10 in this state.

It is to be noted that the treatment liquid 13 is not restricted to being supplied to the surface to be treated S, and a predetermined amount of the treatment liquid 13 may be supplied to a non-illustrated treatment tank (see reference numeral 25 in FIG. 5) in advance, and then the workpiece 10, the first catalyst 14, and the second catalyst 15 are immersed therein.

Since electrons are taken from the metal film 10 when the first catalyst 14 just comes into contact with the metal film 10, metal atoms in the surface of the metal film 10 react with oxygen ions in the treatment liquid 13, and an oxide film 12 is formed on the surface of the metal film 10. For example, when a tungsten (W) film is used as the metal film 10, a tungsten oxide ($WO_2$) is formed on a surface of a tungsten (W) film based on the following reaction formula.

$$W \to W^{4+} + 4e^- \quad \text{Expression (1)}$$

$$W^{4+} + 4e^- + 2H_2O \to WO_2 + 2H_2 \quad \text{Expression (2)}$$

Figure 2:
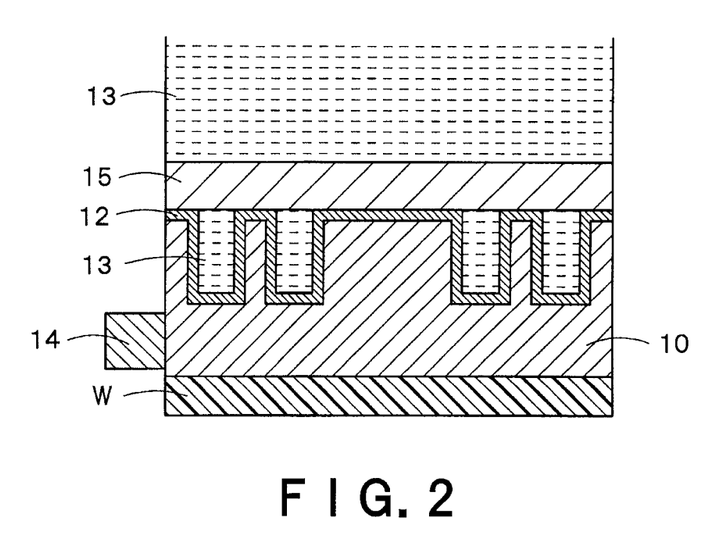
Figure 3:
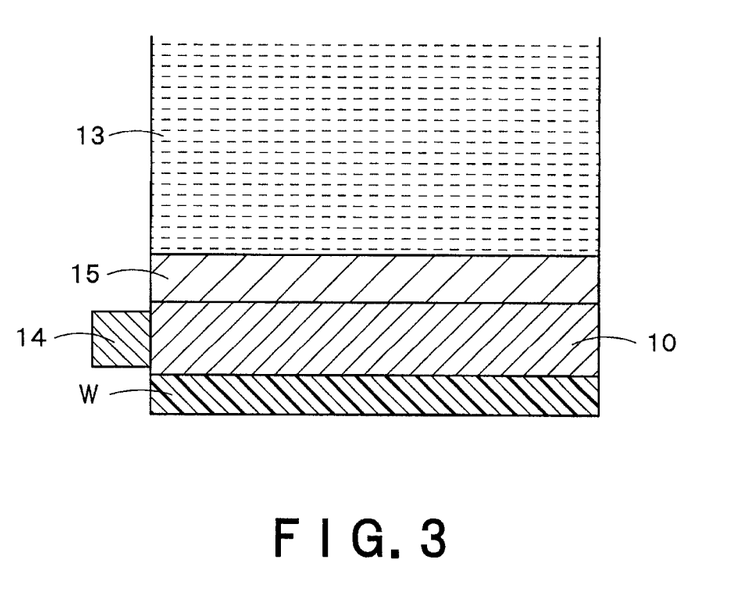

Then, as shown in FIG. 2, the second catalyst 15 and the metal film 10 are brought into contact with each other or moved closer to each other by reducing a distance between a flat plate of the second catalyst 15 and the metal film 10 in a state where the treatment liquid 13 is interposed between them. Consequently, the tungsten dioxide $WO_2$ formed on the surface of the metal film 10 is dissolved by a reaction with the hydroxide ions in the treatment liquid 13 adsorbed in the surface of the second catalyst 15 which is a basic metal oxide catalyst based on the following expression, and eluted into the treatment liquid 13.

$$WO_2 + 2OH^- \to WO_3^- + H_2O \quad \text{Expression (3)}$$

An oxidation reaction based on Expressions (1) and (2) and a reaction based on Expression (3) repeatedly continue and sequentially advance. Consequently, convex portions of the metal film 10 are removed, and the surface of the metal film 10 is flattened as shown in FIG. 3.

In particular, when an oxide of the metal constituting the metal film 10 is conductive like a tungsten oxide ($WO_2$ or $WO_3$), electrons $e^-$ in the reaction of Expression (1) are also supplied from concave portions or the inside of the metal film 10 beyond the oxide of the metal film 10. Thus, the oxidation reaction based on Expression (2) advances on the entire surface of the metal film 10 that is in contact with the treatment liquid 13. On the other hand, the hydroxide ions supplied by the reaction of Expression (3) are preferentially supplied to portions of the metal film 10 close to the second catalyst 15. Thus, the reaction based on Expression (3) preferentially advances in the convex portions of the metal film 10. Consequently, the surface of the metal film 10 is flattened.

It is to be noted that a reaction rate can be further increased by not only simple contact or approach but also by rotating or scanning the second catalyst 15 in a plane parallel to the surface to be treated (see FIG. 4 to FIG. 7).

A description will now be given as to a chemical reaction when a tungsten (W) film is used as the metal film 1 and a hydrogen peroxide ($H_2O_2$) is added to the treatment liquid 13.

A reaction that occurs on the surface of the metal film 10 by the contact with the first catalyst 14 is as represented by the following Expressions (4) and (5).

$$W \to W^{6+} + 6e- \quad \text{Expression (4)}$$

$$2W^{6+} + 12e^- + 3H_2O \to 2WO_3 + 3H_2 \quad \text{Expression (5)}$$

A tungsten trioxide $WO_3$ formed on the surface of the metal film 10 is eluted into the treatment liquid 13 by the hydroxide ions adsorbed in the surface of the second catalyst 15 based on a reaction represented by the following Expression (6) at the convex portions of the metal film 10.

$$WO_3 + 2OH^- \to WO_4^{2-} + H_2O \quad \text{Expression (6)}$$

In the above description the tungsten (W) film has been taken as the metal film 10, however, the metal film 10 is not restricted in particular as long as it is oxidized in the treatment liquid 13 by the first catalyst 14, and its film forming method is not restricted at all. Further, the metal film 10 may contain two or more types of metals, and it may be an alloy or a laminated film.

It is to be noted that the product having the metal film 10 formed on the surface thereof has been taken as the workpiece in the above description, but the present invention can be applied to an example where, e.g., a silicon (Si) film or a compound of silicon (Si) such as a silicon carbide (SiC) is formed on a substrate surface without being restricted to the above description. However, when a film to be treated in this case is oxidized by a function of the first catalyst 14, it turns to a silicon dioxide ($SiO_2$). Thus an aqueous solution containing fluorine (F), e.g., an ammonium fluoride ($NH_4F$) solution is required as a treatment liquid and, on the other hand, flattening can be performed without using the second catalyst 15.

According to the manufacturing method of a semiconductor device of at least one of the foregoing embodiments, since the surface of the workpiece is flattened by bringing the second catalyst 15 and the convex portions of the workpiece into contact with each other or moving them closer to each other to chemically dissolve the convex portions of the workpiece, the surface to be treated of the workpiece can be flattened by the chemical reaction alone rather than mechanical polishing. Consequently, polishing damage to the surface to be treated of the workpiece caused due to the chemical polishing can be suppressed.

A situation where the treatment liquid 13 contains an oxidizing agent will now be described. In this case, it is surely possible to form an oxide on the surface of the metal film 12 without using the first catalyst 14. However, an electron separation effect provided by the first catalyst 14 can dramatically promote oxidizability as compared with an example using the oxidizing agent. That is, using the first catalyst 14 enables improving treatment speed of flattening the surface to be treated.

Furthermore, if the treatment liquid 13 itself has not only an effect of oxidizing the metal film 10 but also an effect of dissolving an oxide on the surface of the metal film 10, the metal film 10 can be dissolved without using the second catalyst 15. However, when the metal film 10 is simply immersed in such a treatment liquid 13, the metal film 10 is isotropically treated, and its surface cannot be flattened.

On the other hand, according to the manufacturing method of a semiconductor device of at least one of the foregoing embodiments, since the dissolving speed is dramatically increased by bringing the second catalyst 15 and the convex portions of the metal film 12 into contact with each other or moving them closer to each other, the convex portions of the surface to be treated can be preferentially reacted and flattened.

(B) Semiconductor Manufacturing Apparatus

Several manufacturing apparatuses suitable for embodying the manufacturing method of a semiconductor device will now be described as embodiments of a semiconductor manufacturing apparatus with reference to FIG. 4 to FIG. 7.

Figure 4:
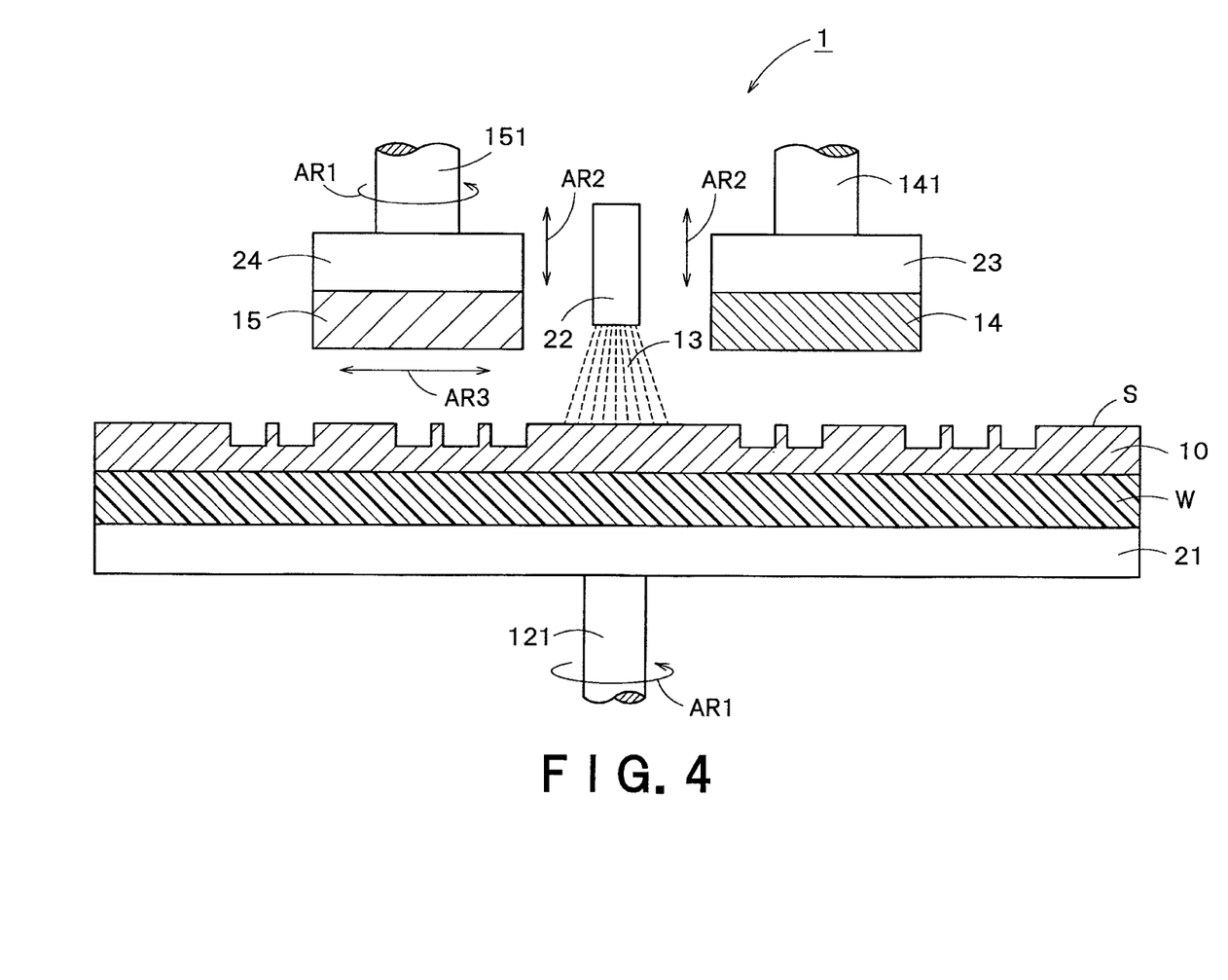
FIG. 4 is an example of a schematic cross-sectional view for explaining an outline configuration of a semiconductor manufacturing apparatus according to Embodiment 1.

A semiconductor manufacturing apparatus 1 shown in FIG. 4 includes a substrate holder 21, a treatment liquid supply unit 22, a first catalyst holder 23, and a second catalyst holder 24.

In this embodiment, the substrate holder 21 corresponds to, e.g., a processing target holder, and holds a wafer substrate W as a workpiece. The substrate holder 21 is connected to a non-illustrated motor through a rotary shaft 121, and rotational driving of the motor enables the substrate holder 21 to rotate in a direction of, e.g., an arrow AR1 in a plane horizontal to a surface S of the wafer substrate W while holding the wafer substrate W. A workpiece film having unevenness, which is a metal film 10 in this embodiment, is formed on an upper surface of the wafer substrate W (a surface on the opposite side of the substrate holder 21 side).

The treatment liquid supply unit 22 is arranged above the substrate holder 21, e.g., above a central portion of a circle when the substrate holder 21 has a circular cylindrical shape, and discharges a treatment liquid 13 from a nozzle to supply the treatment liquid 13 to the surface S of the wafer substrate (spin coating).

The first catalyst holder 23 can hold a first catalyst 14, is coupled with a non-illustrated drive mechanism through a shaft 141, and configured to move in a direction vertical to the surface S of the wafer substrate W, e.g., a direction of an arrow AR2 so that the first catalyst holder 23 can come into contact with the metal film 10. It is to be noted that the first catalyst holder 23 may be configured to be movable in a direction of, e.g., an arrow AR3 in the plane parallel to the surface S of the wafer substrate W.

The second catalyst holder 24 can hold a second catalyst 15, is coupled with a non-illustrated drive mechanism through a shaft 151, and configured to move in a direction vertical to the surface S of the wafer substrate W, e.g., a direction of the arrow AR2 so that the second catalyst holder 24 can come into contact with or move closer to the metal film 10. The second catalyst holder 24 is also configured to be movable in not only the direction vertical to the surface S of the wafer substrate W but also, e.g., the direction of the arrow AR3 in the plane parallel to the surface of the wafer W by the non-illustrated drive mechanism. The second catalyst holder 24 may be also configured to be connected to a non-illustrated motor through the shaft 151 and to be rotatable in, e.g., the direction of the arrow AR1 by the rotational driving of the motor while holding the first catalyst 15.

An example of manufacture of a semiconductor device using the semiconductor manufacturing apparatus 1 according to this embodiment will now be described.

First, the wafer substrate W is held by the substrate holder 21, and the treatment liquid 13 is supplied to the surface S of the wafer substrate W by the treatment liquid supply unit 22 while rotating the substrate holder 21 in, e.g., the direction of the arrow AR1 by the rotational driving of the non-illustrated motor.

Then, the first catalyst 14 is held by the first catalyst holder 23, moved in, e.g., the direction of the arrow AR2 by the non-illustrated drive mechanism, and brought into contact with the surface S of the wafer substrate W. Consequently, electrons are separated from the metal film 10, and metal atoms in the surface of the metal film 10 are reacted with oxygen ions in the treatment liquid 13, thereby forming an oxide film (see reference numeral 12 in FIG. 6) on the surface of the metal film 10 (see Expressions (1), (2), (4), and (5)). It is to be noted that the first catalyst 14 may be brought into contact with the surface S of the wafer substrate W by coupling a drive mechanism (not shown) with the substrate holder 21 and moving the substrate holder 21 in the direction of the arrow AR2 in place of moving the first catalyst holder 23.

Subsequently, the second catalyst 15 is held by the second catalyst holder 24, and moved in, e.g., the direction of the arrow AR2 to come into contact with or move closer to convex portions of the surface S of the wafer substrate W by the non-illustrated drive mechanism. Consequently, an oxide film on top faces of the convex portions of the metal film 10 is locally reacted with hydroxide ions in the treatment liquid 13, and eluted into the treatment liquid 13 (see Expressions (3) and (6)).

Since the formation of the oxide film, the reaction with the hydroxide ions, and the elution into the treatment liquid 13 continuously advance, the surface to be treated S is rapidly flattened. It is to be noted that the second catalyst 15 may be brought into contact with or moved closer to the convex portions of the surface S of the wafer substrate W by coupling a drive mechanism (not shown) to the substrate holder 21 and moving the substrate holder 21 in the direction of the arrow AR2 in place of moving the second catalyst holder 24.

Since the second catalyst holder 24 can move in the plane parallel to the surface S of the substrate W (see the arrow AR3), the surface S of the wafer substrate W can be scanned at the time of the elution of the oxide film. In this case, sizes of the second catalyst 15 and the second catalyst holder 24 can be reduced to be smaller than a size of unevenness which needs to be flattened.

Figure 5:
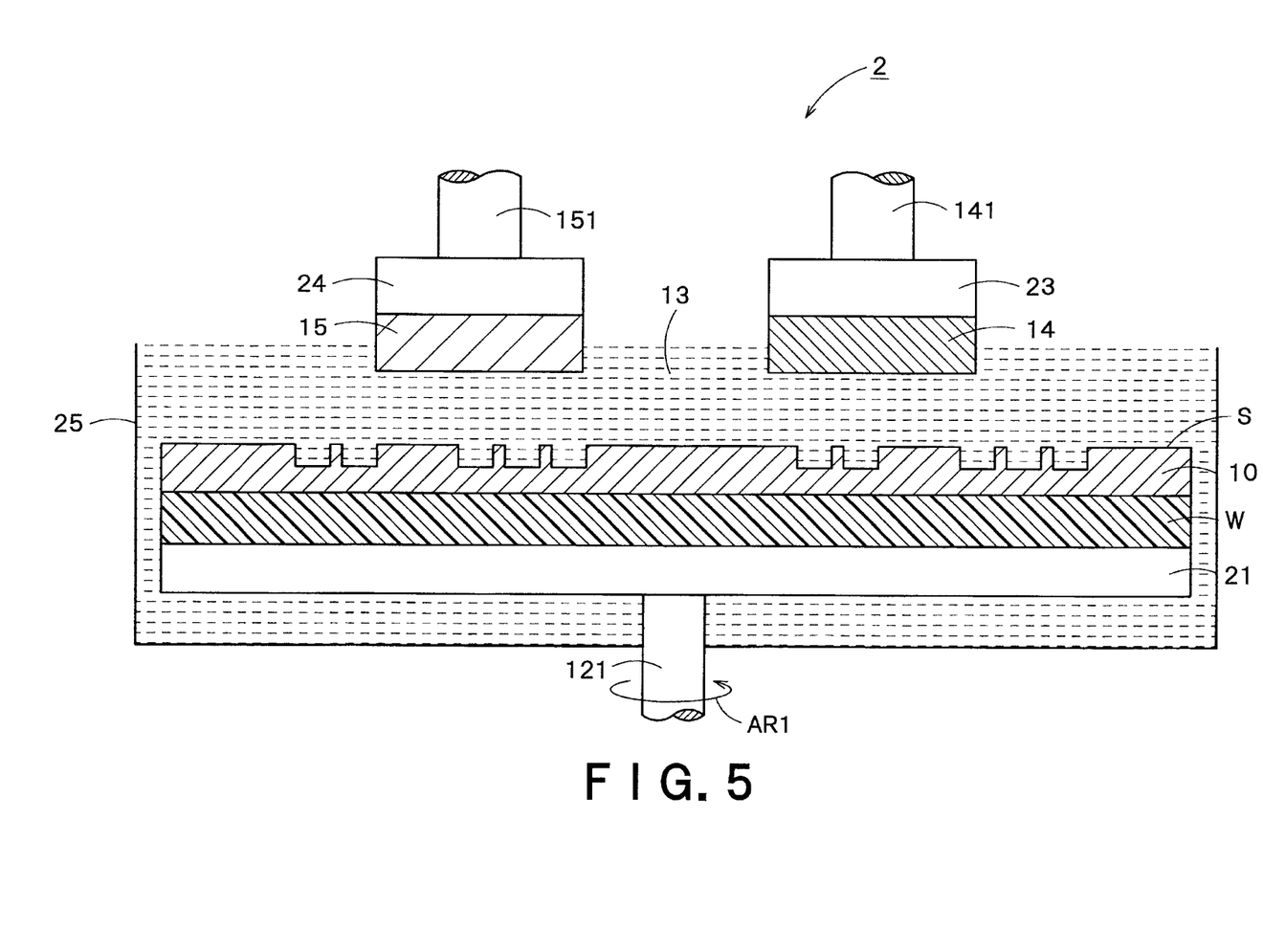
FIG. 5 is an example of a schematic cross-sectional view for explaining a modification of the semiconductor manufacturing apparatus depicted in FIG. 4.
Figure 6:
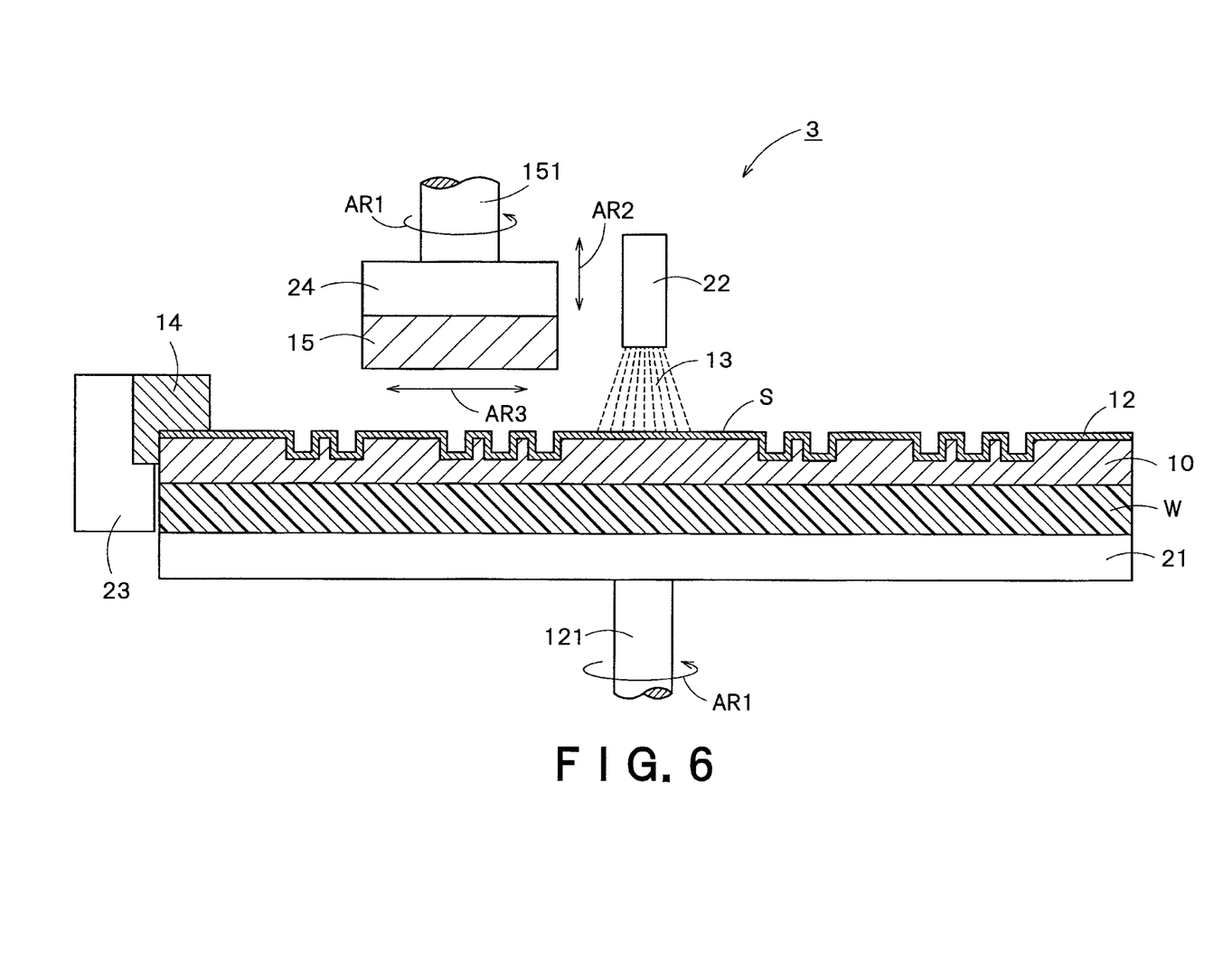
FIG. 6 is an example of a schematic cross-sectional view for explaining an outline configuration of a semiconductor manufacturing apparatus according to Embodiment 2.

In the semiconductor manufacturing apparatus 1 shown in FIG. 4, the treatment liquid 13 is supplied to the surface S of the wafer substrate W by the treatment liquid supply unit 22, but the present invention is not restricted thereto, a treatment tank 25 that can accommodate the substrate holder 21 may be provided, and the treatment tank 25 may be filled with the treatment liquid 13 as represented by, e.g., a semiconductor manufacturing apparatus 2 shown in FIG. 5.

In the semiconductor manufacturing apparatus 1 shown in FIG. 4, the first catalyst holder 23 is arranged to face the surface to be treated of the wafer substrate W. However, considering that a function of the first catalyst 14 is separating the electrons from the metal film 10, the first catalyst holder 23 may be arranged at an outer peripheral portion of the wafer substrate W like a semiconductor manufacturing apparatus shown in FIG. 6. In this case, since a scanning field of the second catalyst holder 24 (see the arrow AR3) expands, processing speed can be further improved, the first catalyst holder 23 does not come into contact with a region where a semiconductor element is formed in a surface region of the wafer substrate W, and hence an effective shot region in subsequent lithography can be prevented from being contaminated with a metal.

Figure 7:
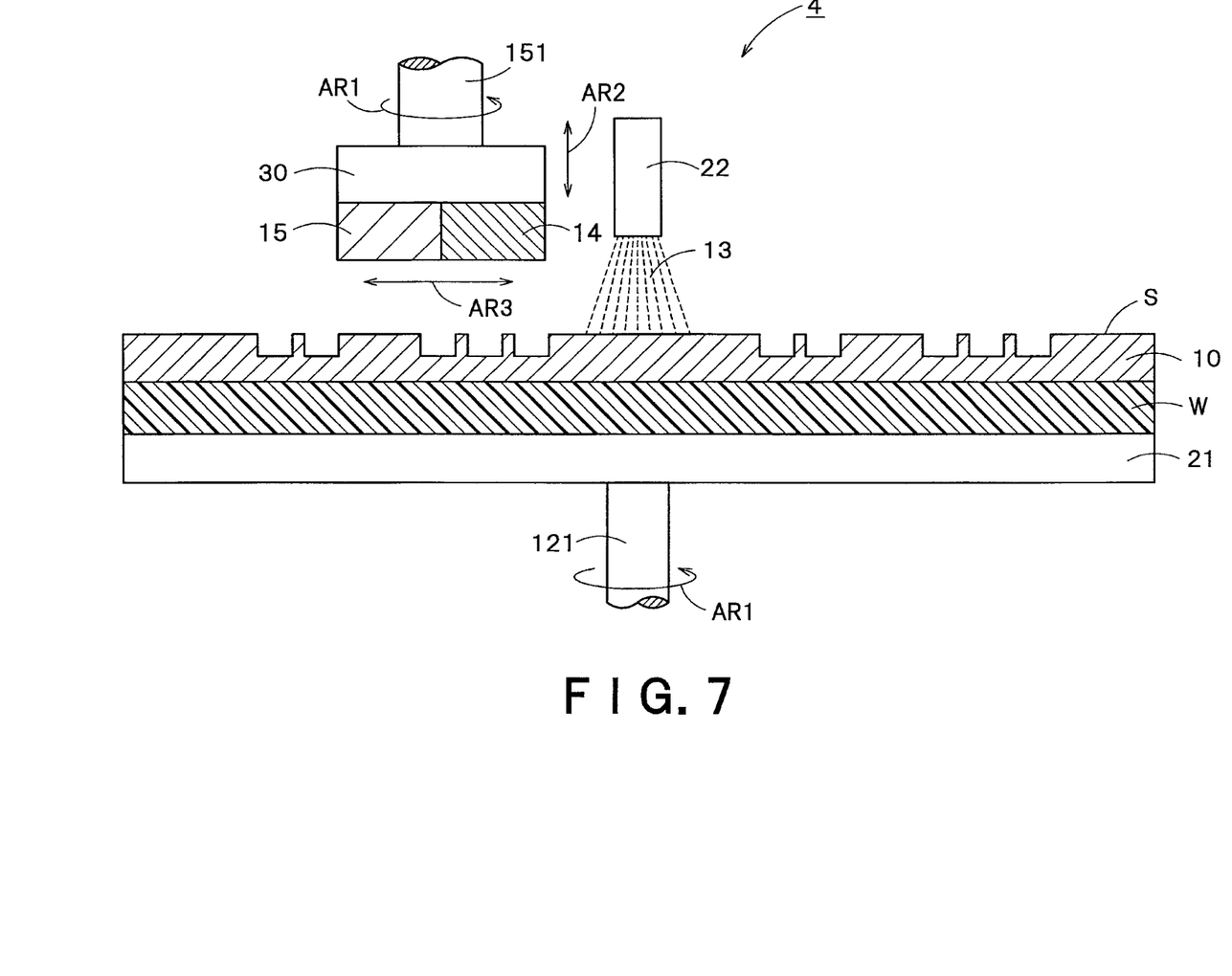
FIG. 7 is an example of a schematic cross-sectional view for explaining an outline configuration of a semiconductor manufacturing apparatus according to Embodiment 3.

Furthermore, like a semiconductor manufacturing apparatus 4 shown in FIG. 7, an integrated catalyst holding unit 30 may be configured to simultaneously hold the first catalyst 14 and the second catalyst 15. In this case, since a drive mechanism of the apparatus can be simplified, the semiconductor manufacturing apparatus can be provided at low costs. In this embodiment, the catalyst holding unit 30 corresponds to, e.g., a catalyst holder.

According to the semiconductor manufacturing apparatus of at least one of the foregoing embodiments, since the second catalyst holder 24 or the catalyst holding unit 30 that can hold the second catalyst 15 that chemically dissolves the convex portions of the workpiece into the treatment liquid 13 by contact or approach is included, the surface to be treated can be flattened while suppressing polishing damage to the surface to be treated caused due to the mechanical polishing.

Moreover, according to the semiconductor manufacturing apparatus of at least one of the foregoing embodiments, since the first catalyst holder 23 or the catalyst holding unit 30 that can hold the first catalyst 14 which exerts the electron separation effect by contact with the workpiece is included, the surface to be treated of the workpiece can be rapidly flattened.

While certain embodiments have been described, these embodiments have been presented by way of example only, and are not intended to limit the scope of the inventions.

For example, the example of manufacture of a semiconductor device has been described in the foregoing embodiments, but the present invention is not restricted thereto, and it can be likewise applied to manufacture of a micro device such as an MEMS.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device manufacturing apparatus comprising:
   a processing target holder configured to hold a workpiece with includes a first metal;
   a first catalyst holder configured to hold a first catalyst, the first catalyst promoting formation of a metal oxide film of the first metal onto a surface of the workpiece by contact with the workpiece;
   a second catalyst holder configured to hold a second catalyst, the second catalyst promoting elution of the metal oxide film into a treatment liquid by contact with or being moved closer to at least a part of the surface of the metal oxide film,
   wherein the first catalyst holder and the second catalyst holder are independently controlled.

2. The apparatus of claim 1, wherein the first catalyst holder provided at a periphery of the processing target holder.

3. The apparatus of claim 2, wherein the first catalyst holder is movable in a plane horizontal to the surface of the workpiece.

4. The apparatus of claim 3, wherein the movement comprises at least one of rotation and translation.

5. The apparatus of claim 2, wherein the second catalyst holder is movable in a plane horizontal to the surface of the workpiece.

6. The apparatus of claim 5, wherein the movement comprises at least one of rotation and translation.

7. The apparatus of claim 1, further comprising a treatment liquid supplier which supplies the treatment liquid to the surface of the workpiece.

8. The apparatus of claim 1, further comprising a treatment tank which accommodates the treatment liquid in such a manner that at least the surface of the workpiece is immersed in the treatment liquid.

9. The apparatus of claim 1, wherein the processing target holder is rotatable in a plane horizontal to the surface of the workpiece.

10. The apparatus of claim 1, wherein the first and second catalyst holders are respectively connected to a first and second shafts.

11. The apparatus of claim 1, wherein the first and second catalyst holders are movable in a direction vertical to a surface of the workpiece and in a direction parallel thereto.

12. The apparatus of claim 11, wherein the second catalyst holder is rotatable around the second shaft.

13. A semiconductor device manufacturing apparatus comprising:
    a processing target holder configured to hold a workpiece which includes a first metal;
    a first catalyst holder configured to hold a first catalyst; and
    a second catalyst holder configured to hold a second catalyst,
    wherein
    the first catalyst has a lower ionization tendency than the first metal, and
    the first catalyst holder and the second catalyst holder are independently controlled.

14. The apparatus of claim 13, wherein the first catalyst holder provided at a periphery of the processing target holder.

15. The apparatus of claim 14, wherein the first catalyst holder is movable in a plane horizontal to the surface of the workpiece.

16. The apparatus of claim 15, wherein the movement comprises at least one of rotation and translation.

17. The apparatus of claim 14, wherein the second catalyst holder is movable in a plane horizontal to the surface of the workpiece.

18. The apparatus of claim 17, wherein the movement comprises at least one of rotation and translation.

19. The apparatus of claim 13, further comprising a treatment liquid supplier which supplies a treatment liquid of an oxide film on the workpiece to the surface of the workpiece.

20. The apparatus of claim 13, further comprising a treatment tank which accommodates the treatment liquid in such a manner that at least the surface of the workpiece is immersed in the treatment liquid.

21. The apparatus of claim 13, wherein the processing target holder is rotatable in a plane horizontal to the surface of the workpiece.

22. The apparatus of claim 13, wherein the second catalyst includes an alkali metal oxide, an alkaline-earth metal oxide, or a rare-earth metal oxide.

23. The apparatus of claim 13, wherein the first catalyst includes Ag, Pd or Au, and the second catalyst includes MgO or CaO.

24. The apparatus of claim 13, wherein the first and second catalyst holders are respectively connected to a first and second shafts.

25. The apparatus of claim 13, wherein the first and second catalyst holders are movable in a direction vertical to a surface of the workpiece and in a direction parallel thereto.

26. The apparatus of claim 25, wherein the second catalyst holder is rotatable around the second shaft.

* * * * *